US011648594B2

(12) United States Patent
Shin et al.

(10) Patent No.: US 11,648,594 B2
(45) Date of Patent: May 16, 2023

(54) WAFER CLEANING APPARATUS AND WAFER CLEANING METHOD USING THE SAME

(71) Applicant: Samsung Electronics Co., Ltd., Suwon-si (KR)

(72) Inventors: Seung Min Shin, Daejeon (KR); Hun Jae Jang, Suwon-si (KR); Seok Hoon Kim, Seongnam-si (KR); Young-Hoo Kim, Yongin-si (KR); In Gi Kim, Hwaseong-si (KR); Tae-Hong Kim, Seoul (KR); Kun Tack Lee, Suwon-si (KR); Ji Hoon Cha, Seoul (KR); Yong Jun Choi, Gwacheon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 172 days.

(21) Appl. No.: 16/890,490

(22) Filed: Jun. 2, 2020

(65) Prior Publication Data

US 2021/0060625 A1    Mar. 4, 2021

(30) Foreign Application Priority Data

Sep. 3, 2019    (KR) .......................... 10-2019-0108585

(51) Int. Cl.
  *B08B 7/00*    (2006.01)
  *B08B 3/10*    (2006.01)
  (Continued)

(52) U.S. Cl.
  CPC .............. *B08B 7/0042* (2013.01); *B08B 3/10* (2013.01); *B08B 7/0064* (2013.01);
  (Continued)

(58) Field of Classification Search
  CPC ......... H01L 21/67115; H01L 21/67248; H01L 21/67098
  See application file for complete search history.

(56) References Cited

U.S. PATENT DOCUMENTS 7,947,968 B1 * 5/2011 Markle .................. G03B 27/54
                                                           372/101
8,282,766 B2  10/2012 Eilmsteiner et al.
(Continued)

FOREIGN PATENT DOCUMENTS

JP        6266680 B2    1/2018
JP     2018026436 A    2/2018
(Continued)

*Primary Examiner* — Natasha N Campbell
(74) *Attorney, Agent, or Firm* — Harness, Dickey & Pierce, P.L.C.

(57) ABSTRACT

A wafer cleaning apparatus is provided. The wafer cleaning apparatus includes comprising a chamber configured to be loaded with a wafer, a nozzle on the wafer and configured to provide liquid chemicals on an upper surface of the wafer, a housing under the wafer, a laser module configured to irradiate laser on the wafer, a transparent window disposed between the wafer and the laser module, and a controller configured to control on/off of the laser module, wherein the controller is configured to control repetition of turning the laser module on and off, and retain temperature of the wafer within a temperature range, and a ratio of time when the laser module is on in one cycle including on/off of the laser module is 30% to 50%.

8 Claims, 15 Drawing Sheets

(51) Int. Cl.
  *H01L 21/67* (2006.01)
  *H01L 21/687* (2006.01)
  *H01L 21/311* (2006.01)

(52) U.S. Cl.
  CPC .. *H01L 21/31111* (2013.01); *H01L 21/67051* (2013.01); *H01L 21/67075* (2013.01); *H01L 21/67098* (2013.01); *H01L 21/67248* (2013.01); *H01L 21/68764* (2013.01)

(56) References Cited

U.S. PATENT DOCUMENTS

| | | | | |
|---|---|---|---|---|
| 2002/0137311 | A1* | 9/2002 | Timans | C30B 25/105 438/798 |
| 2004/0018008 | A1* | 1/2004 | Koren | C30B 25/105 392/416 |
| 2005/0287685 | A1* | 12/2005 | McFadden | G01R 31/2874 700/121 |
| 2012/0080061 | A1* | 4/2012 | Kim | H01L 21/67028 34/427 |
| 2018/0047559 | A1 | 2/2018 | Kamiya et al. | |
| 2018/0337070 | A1* | 11/2018 | Bang | B08B 3/08 |
| 2019/0047118 | A1* | 2/2019 | Okamoto | B24B 53/007 |
| 2019/0311923 | A1* | 10/2019 | Kim | H01L 21/67051 |
| 2020/0075359 | A1 | 3/2020 | Lee et al. | |
| 2020/0251358 | A1 | 8/2020 | Cha et al. | |

FOREIGN PATENT DOCUMENTS

| | | |
|---|---|---|
| JP | 6468956 B2 | 2/2019 |
| KR | 1547318 B1 | 5/2015 |
| KR | 20160042688 A | 4/2016 |
| KR | 101931969 B1 | 12/2018 |
| KR | 1977386 | 1/2019 |
| KR | 20190045520 A | 5/2019 |

* cited by examiner

WAFER CLEANING APPARATUS AND WAFER CLEANING METHOD USING THE SAME

This application claims priority to Korean Patent Application No. 10-2019-0108585, filed on Sep. 3, 2019, and all the benefits accruing therefrom under 35 U.S.C. § 119, the disclosure of which is incorporated herein by reference in its entirety.

BACKGROUND

1. Technical Field

The present disclosure relates to wafer cleaning apparatuses and/or wafer cleaning methods using the same.

2. Description of the Related Art

A wet cleaning process in semiconductor fabrication etches a hard mask or the like on a wafer with liquid chemicals at high temperature. Wet cleaning processes have been conducted by a batch equipment in a related art. The batch equipment indicates a device which wet-cleans a set of wafers while precipitating a plurality of wafers, as one set, in liquid chemicals simultaneously, rather than one wafer.

With respect to the batch equipment, a problem may occur such as flow defect, dry fault, degradation in distribution uniformity or the like on the wafer. Accordingly, it is required for conversion into a single wafer equipment in order to solve the above-mentioned problem. A single wafer equipment indicates a device which applies each of wafers to the wet cleaning process one by one.

However, in the single wafer equipment, an etch rate (E/R) may become different according to position of a wafer. Accordingly, a method for tuning such an etch rate would be beneficial.

SUMMARY

At least one embodiment provides wafer cleaning apparatuses improved with etch efficiency by retaining temperature of a wafer within a previously established, or, alternatively, desired temperature range.

At least one embodiment provides wafer cleaning methods improved with etch efficiency by retaining temperature of a wafer within a previously established, or, alternatively, desired temperature range.

In one embodiment, a wafer cleaning apparatus may comprise a chamber configured to be loaded with a wafer, a nozzle on the wafer and configured to provide liquid chemicals on an upper surface of the wafer, a housing under the wafer, a laser module configured to irradiate laser on the wafer, a transparent window disposed between the wafer and the laser module, and a controller configured to control on/off of the laser module, wherein the controller is configured to control repetition of turning the laser module on and off, and retain a temperature of the wafer within a temperature range, and a ratio of time the laser module is on in one cycle of the on/off state of the laser module is 30% to 50%.

In one embodiment, a method for cleaning a wafer may include loading a wafer within a chamber, providing liquid chemicals on an upper surface of the wafer, irradiating laser to a lower surface of the wafer by turning on a laser module, retaining a temperature of the wafer within a temperature range by controlling an on/off state of the laser module, etching the wafer while the temperature of the wafer is retained within the temperature range, turning off the laser module after etching of the wafer completes, and unloading the wafer from the chamber.

In one embodiment, a method for cleaning a wafer may include loading a wafer including a first layer and a second layer within a chamber, providing liquid chemicals on an upper surface of the wafer, irradiating laser to a lower surface of the wafer by turning on a laser module, retaining a temperature of the wafer within a temperature range by controlling an on/off state of the laser module, a ratio of time the laser module is on is 30% to 50% in one cycle of the on/off state of the laser module, and etching the second layer of the wafer while the temperature of the wafer is retained within the temperature range.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Hereinbelow, a wafer cleaning apparatus according to some example embodiments will be described with reference to FIGS. 1 to 4.

Figure 1:
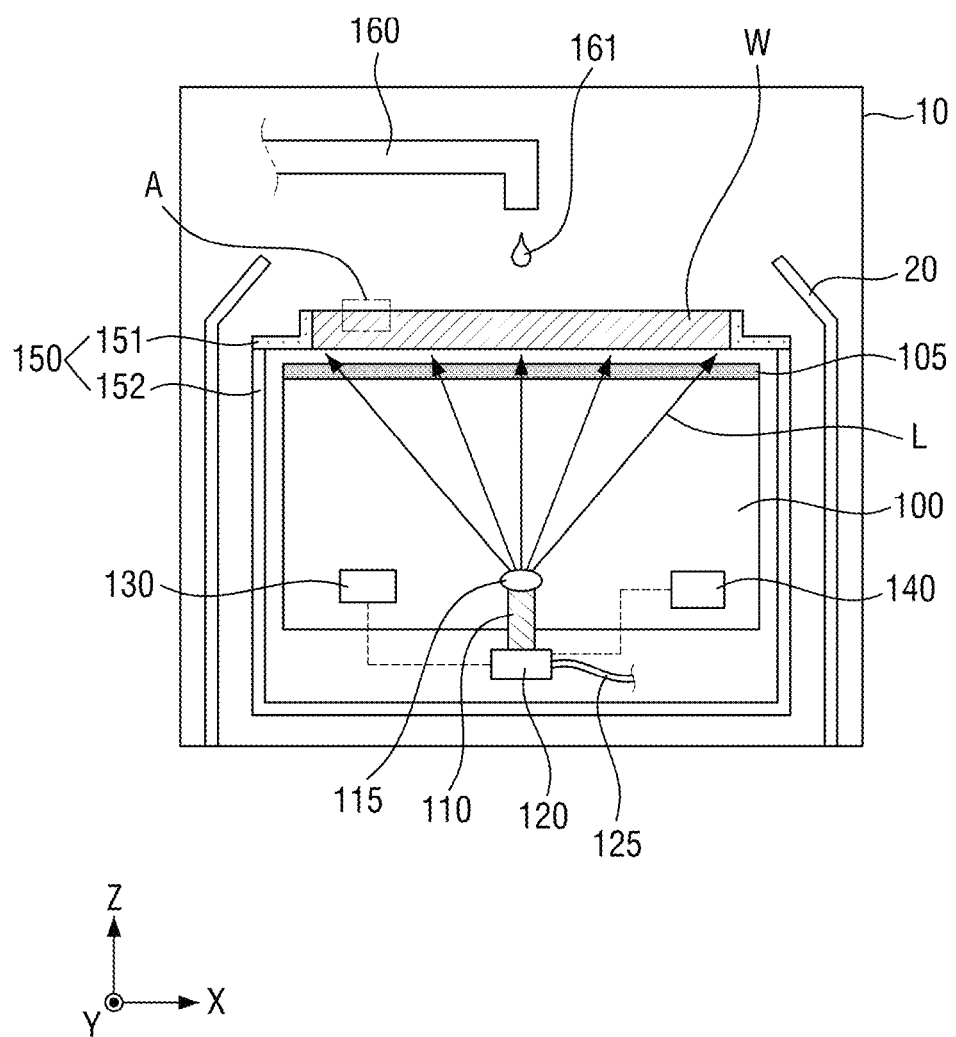
FIG. 1 is a view provided to explain a wafer cleaning apparatus according to some example embodiments.
Figure 2:
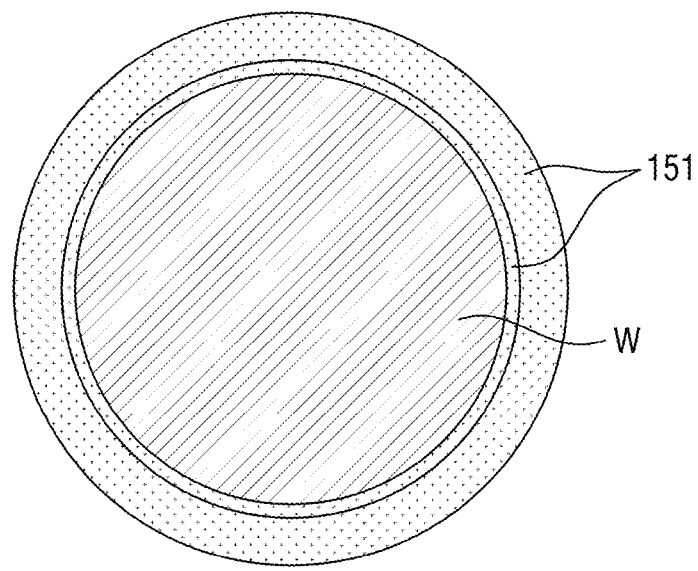
FIG. 2 is a top view provided to explain a wafer cleaning apparatus according to some example embodiments.
Figure 2:
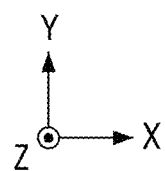
Figure 3:
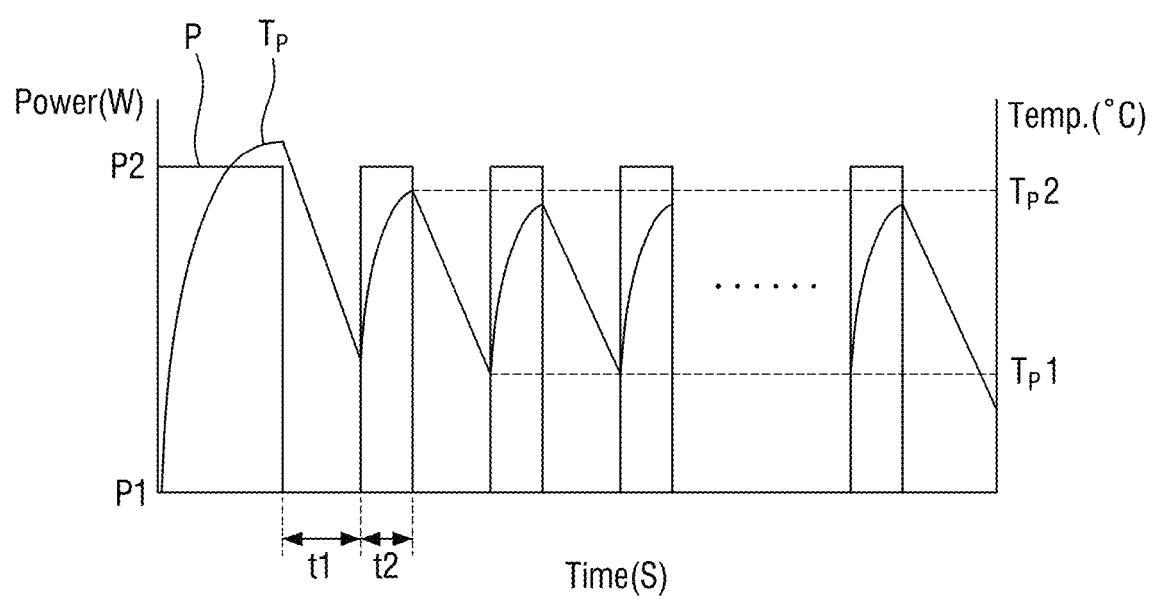
FIGS. 3 and 4 are graphical representation provided to explain temperature change of a wafer positioned on a wafer cleaning apparatus according to some example embodiments.
Figure 4:
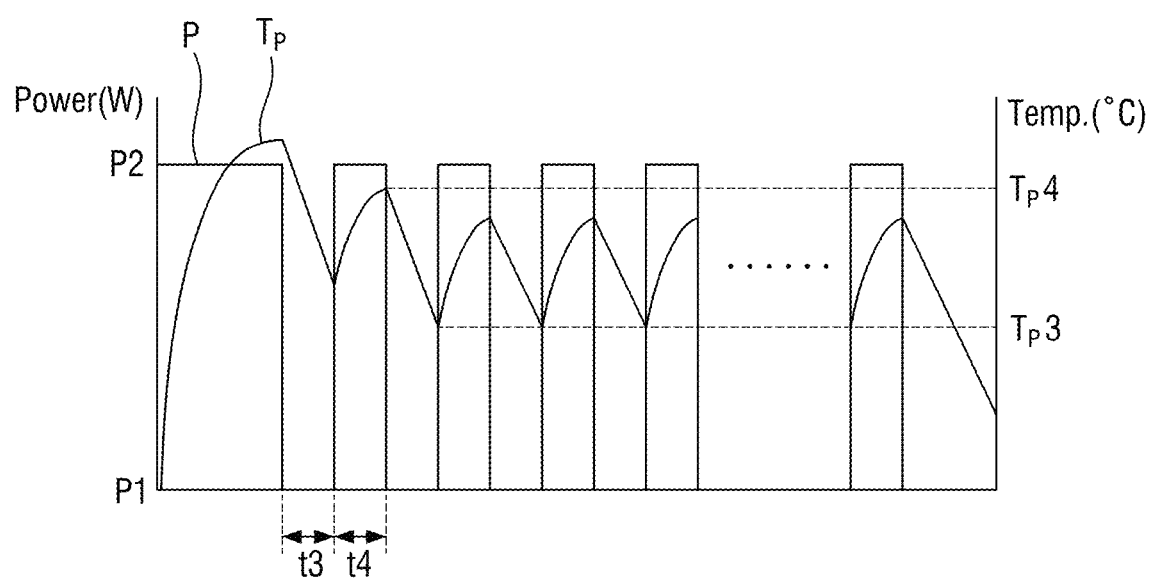

FIG. 1 is a view provided to explain a wafer cleaning apparatus according to some example embodiments. FIG. 2 is a top view provided to explain a wafer cleaning apparatus according to some example embodiments. FIGS. 3 and 4 are graphical representation provided to explain temperature change of a wafer positioned on a wafer cleaning apparatus according to some example embodiments.

Referring to FIGS. 1 to 4, the wafer cleaning apparatus according to some example embodiments may include a chamber 10, a bowl 20, a housing 100, a transparent window 105, a laser module 110, an aspherical lens 115, a controller 120, a laser supply unit 125, an optical intensity detector 130, a temperature sensor 140, a spinner 150, and/or a nozzle 160.

A first direction X may be any one direction among horizontal directions. A second direction Y may be any one direction among horizontal directions different from the first direction X. The second direction Y may intersect the first direction X. For example, the second direction Y may be orthogonal to the first direction X. A third direction Z may intersect the first direction X and the second direction Y. The third direction Z may be orthogonal to both of the first direction X and the second direction Y, for example. The third direction Z may be, for example, an orthogonal direction. Accordingly, the first direction X, the second direction Y and the third direction Z may be orthogonal from one another.

A wet etching process and a cleaning process may be performed within the chamber 10. The wafer W may be loaded within the chamber 10.

The housing 100 may be positioned under the wafer W. That is, the housing 100 and the wafer W may be disposed sequentially in the third direction Z. The housing 100 may heat a lower surface of the wafer W. An upper surface of the housing 100 may be adjacent to a lower surface of the wafer W. However, the housing 100 and the wafer W may be spaced apart from each other.

The housing 100 may include the transparent window 105, the laser module 110, the aspherical lens 115, the optical intensity detector 130, and/or the temperature sensor 140 therewithin. The housing 100 may function to fix and support each position of the transparent window 105, the laser module 110, the aspherical lens 115, the optical intensity detector 130, and/or the temperature sensor 140.

The housing 100 may be fixed under the wafer W. Accordingly, even though the wafer W rotates on a horizontal surface in parallel with an upper surface of the housing 100, the housing 100 may not rotate. However, the present disclosure is not limited thereto. That is, according to some other example embodiments, the housing 100 may rotate with the wafer W or rotate separately from the wafer W.

The spinner 150 may be in contact with a side surface of the wafer W. The spinner 150 may rotate the wafer W by holding the wafer W on a side surface of the wafer W. As the spinner 150 rotates on a horizontal surface in parallel with an upper surface of the housing 100, the wafer W may rotate in a same direction. However, the present disclosure is not limited thereto.

When the wafer W rotates with the spinner 150, liquid chemicals 161 supplied to an upper surface of the wafer W may be uniformly distributed on an upper surface of the wafer W. Rotation of the wafer W with the spinner 150 may encourage an etch rate of an upper surface of the wafer W to be uniform.

The spinner 150 may include a grip portion 151 and a support portion 152. The grip portion 151 may be a part which is in contact with a side surface of the wafer W. The grip portion 151 may be fixed to the wafer W by being in direct contact with a side surface of the wafer W. Accordingly, the grip portion 151 may rotate simultaneously with the wafer W on a horizontal surface in parallel with an upper surface of the housing 100.

The grip portion 151 may include an insulating material. The wafer W is warmed to heated with several constituent elements within the housing 100, e.g., the laser module 110, and thus the grip portion 151 may block heat transfer so that another portion within the chamber 10 is prevented from being damaged.

The support portion 152 may be connected with the grip portion 151. The support portion 152 may extend to a downside of the grip portion 151. The support portion 152 may support the grip portion 151. The support portion 152 may surround an outer side surface of the housing 100.

The support portion 152 may rotate on a horizontal surface in parallel with an upper surface of the housing 100, together with the grip portion 151. For example, the entire support portion 152 may rotate, or only a portion of the support portion 152 may rotate. When only a portion of the support portion 152 rotates, a rotating portion among the support portion 152 may be connected with the grip portion 151. Through the above, the wafer W may rotate on a horizontal surface in parallel with an upper surface of the housing 100.

The spinner 150 may rotate the wafer W on a horizontal surface in parallel with an upper surface of the housing 100, but at proper speed. When rotation speed of the spinner 150 is too fast, an edge portion of the wafer W may be cooled down differently from other portions of the wafer W, and temperature may not be distributed uniformly. For example, an etch rate may be different in a center portion and an edge portion of the wafer W.

Accordingly, rotation speed of the spinner 150 may be limited, for example, to 100-300 rpm. However, the present disclosure is not limited thereto.

The nozzle 160 may be positioned on the wafer W and the spinner 150. The nozzle 160 may supply the liquid chemicals 161 to an upper surface of the wafer W. The nozzle 160 may drop the liquid chemicals 161 to a center portion of the wafer W. The wafer W may expand the dropping liquid chemicals 161 to an entire upper surface of the wafer W while rotating. Flow may be applied in a down direction for fixation of the wafer W and regular distribution of the liquid chemicals 161. Through the above, the liquid chemicals 161 may be moved from a center of an upper surface of the wafer W to a surrounded region.

Although it is illustrated in FIG. 1 that the nozzle 160 sprays the liquid chemicals 161 in a down direction from an upper surface of the wafer W, the present disclosure is not limited thereto. That is, according to some other example embodiments, the nozzle 160 may be disposed on a side surface of the wafer W at a point higher than an upper surface of the wafer W. Further, according to some other example embodiments, the nozzle 160 may discharge the liquid chemicals 161 in a side surface direction, and supply the liquid chemicals 161 to an upper surface of the wafer W.

The liquid chemicals 161 may be solution which etches an upper surface of the wafer W. For example, a silicon nitride layer (SiN) and/or polysilicon within the wafer W may become an etched object. However, the present disclosure is not limited thereto.

The liquid chemicals 161 may be different according to an etched object material. The liquid chemicals 161 may include, for example, at least one of phosphoric acid, ammonia solution, and tetramethylammonium hydroxide (TMAH). However, the present disclosure is not limited thereto.

The liquid chemicals 161 may be supplied by the nozzle 160. The nozzle 160 may discharge the liquid chemicals 161 to an upper surface of the wafer W, and provide the liquid chemicals 161 at proper amount and speed. When the liquid chemicals 161 are supplied too much or too fast, elevation of temperature of the wafer W may become uneven. Accordingly, for example, the nozzle 160 may provide the liquid chemicals 161 on the wafer W at 0.1 L/min~1 L/min of speed. However, the present disclosure is not limited thereto.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The bowl 20 may be disposed on an outer portion of the wafer W, the spinner 150 and the housing 100. The bowl 20 may extend in the third direction Z to be higher than an upper surface of the wafer W. The bowl 20 may block outer discharge of the liquid chemicals 161 and fume in which the liquid chemicals 161 are evaporated. The bowl 20 may block another portion within the chamber 10 from being damaged.

The laser module 110 may be positioned within the housing 100. The laser module 110 may irradiate the laser entirely on a lower surface of the wafer W. The laser module 110 may be disposed under the transparent window 105. The laser L1 irradiated by the laser module 110 may reach to a lower surface of the wafer W as passing through the transparent window 105.

The wavelength of the laser provided from the laser module 110 may be, for example, 300 nm to 1,100 nm. However, the present disclosure is not limited thereto.

The transparent window 105 may be positioned on an upper surface of the housing 100. The transparent window 105 may be a transparent material in which the laser L may penetrate through. For example, the transparent window 105 may include Quartz. However, the present disclosure is not limited thereto.

The transparent window 105 and the wafer W may be disposed to be closely adjacent to each other. Accordingly, the laser L penetrating through the transparent window 105 may not be discharged to another place than a lower surface of the wafer W. However, the present disclosure is not limited thereto.

The transparent window 105 and the wafer W may be spaced apart from each other. The above may be exemplified because the wafer W should rotate by the spinner 150 but the housing 100 installed with the transparent window 105 may not necessarily rotate.

As a lower surface of the wafer W may be heated entirely, a lower surface of the wafer W and an interfacial surface of the transparent window 105 may correspond to each other. That is, an edge portion of the wafer W may be exposed to the laser L by the transparent window 105.

The aspherical lens 115 may be disposed within the housing 100. The aspherical lens 115 may be connected with the laser module 110.

The aspherical lens 115 may process the laser. Specifically, the laser L supplied with the laser module 110 may have Gaussian profile. The aspherical lens 115 may process the profile of the laser into a necessary, or, alternatively, desired shape.

Although it is illustrated in FIG. 1 that the aspherical lens 115 is formed as one lens, this is only for convenience of explanation, and thus, the present disclosure is not limited thereto. That is, according to some other example embodiments, the aspherical lens 115 may include a plurality of lenses.

The laser supply unit 125 may supply the laser L to the laser module 110. Although it is illustrated in FIG. 1 that the laser supply unit 125 is connected with the controller 120, this is only for convenience of explanation, and the present disclosure is not limited thereto. That is, according to some other example embodiments, the laser supply unit 125 may be directly connected with the laser module 110.

The laser supply unit 125 may form a path where the laser L is supplied, as being connected externally. The laser supply unit 125 may include, for example, an optical fiber. However, the present disclosure is not limited thereto.

The controller 120 may control on/off of the laser module 110. In other words, the control 120 may control turning the laser module 110 on and off, or, alternatively, the on/off state of the laser module 110. Although it is illustrated in FIG. 1 that the controller 120 is disposed between the housing 100 and the spinner 150, the present disclosure is not limited thereto.

The controller 120 (and other circuitry) may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Further, although it is illustrated in FIG. 1 that the controller 120 is in contact with the laser module 110, the present disclosure is not limited thereto. That is, in some other example embodiments, the controller 120 may be spaced apart from the laser module 110.

Referring to FIGS. 3 and 4, as the controller 120 may control the laser module 110 repeatedly being on/off, the temperature Tp of the wafer W may be retained within a previously established, or, alternatively desired, temperature range. That is, the controller 120 may control the laser module 110 to turn on and off repeatedly, and thus control the temperature Tp of the wafer W to be within a temperature range.

Referring to FIG. 3, the controller 120 may control on/off of the laser module 110 to be performed repeatedly. Respective one on and one off of the laser module 110 may be defined as one cycle. The laser module 110 may repeat a cycle of off and on after being initially turned on.

For example, within one cycle of the laser module 110, a ratio of time when the laser module 110 is on may be 30% to 50%. According to some example embodiments, within one cycle of the laser module 110, a ratio of time when the laser module 110 is on may be 30%, and a ratio of time when the laser module 110 is off may be 70%. That is, t2 (time when the laser module 110 is on):t1 (time when the laser module 110 is off) may be 3:7.

Referring to FIG. 4, according to some other example embodiments, within one cycle of the laser module 110, a ratio of time when the laser module 110 is on may be 50%, and a ratio of time when the laser module 110 is off may be 50%. That is, t4 (time when the laser module 110 is on):t3 (time when the laser module 110 is off) may be 5:5.

Time t1 when the laser module 110 is on may be, for example, 0.5 to 3 seconds. However, the present disclosure is not limited thereto.

Power P of the laser L2 irradiated from the laser module 110 may be uniformly retained in respective cases in which the laser module 110 is on/off.

For example, when the laser module 110 is on, second power P2 of the laser L irradiated from the laser module 110 may be 0.1 kW to 100 kW. For example, when the laser module 110 is off, first power P1 of the laser L irradiated from the laser module 110 may be 0 kW. However, the present disclosure is not limited thereto. That is, according to some other example embodiments, the first power P1 of the laser L may be more than 0 kW.

Referring to FIG. 3, the controller 120 may retain the temperature Tp of the wafer W between the first temperature Tp1 and the second temperature Tp2 which is more than the first temperature Tp1. For example, each of the first temperature Tp1 and the second temperature Tp2 may be 170° C. to 250° C. For example, the first temperature Tp1 may be 170° C., and the second temperature Tp2 may be 250° C. However, the present disclosure is not limited thereto.

Temperature Tp of the wafer W may be elevated after the laser module 110 is initially on. Next, while on/off of the laser module 110 is performed repeatedly, temperature Tp of the wafer W may be retained between the first temperature Tp1 and the second temperature Tp2.

While the temperature Tp of the wafer W is retained between the first temperature Tp1 and the second temperature Tp2, which ranges within a previously established, or, alternatively, desired temperature range, an etch process of the wafer W (e.g., wet etching) may be performed. After an etching process of the wafer W completes, the laser module 110 may be off, and temperature of the wafer W may be lower than the first temperature Tp1.

Referring to FIG. 4, the controller 120 may retain the temperature Tp of the wafer W between third temperature Tp3 and fourth temperature Tp4 which is higher than the third temperature Tp3. For example, each of the third temperature Tp3 and the fourth temperature Tp4 may be 170° C. to 250° C. For example, the third temperature Tp3 may be 170° C., and the fourth temperature Tp4 may be 250° C. However, the present disclosure is not limited thereto.

Temperature Tp of the wafer W may be elevated after the laser module 110 is initially on. Subsequently, while on/off of the laser module 110 is performed repeatedly, the temperature Tp of the wafer W may be retained between the third temperature Tp3 and the fourth temperature Tp4.

While an etching process with respect to the wafer W (e.g., wet etching) is performed, the temperature Tp of the wafer W may be retained between the third temperature Tp3 and the fourth temperature Tp4, which ranges within a previously established, or, alternatively, desired temperature range. After an etching process with respect to the wafer W completes, the laser module 110 may be off, and the temperature of the wafer W may be lowered compared to the third temperature Tp3.

An etch rate of a layer formed in the wafer W may be mainly influenced by the temperature and concentration of an etchant. In the wafer cleaning apparatus according to some example embodiments, for example, the wafer W may include a silicon nitride layer (SiN) and a silicon oxide layer (SiO2), and a silicon nitride layer (SiN) may be selectively wet-etched.

When the etch temperature increases in order to increase an etch rate, a problem may occur such that a silicon oxide layer (SiO2) may be etched in addition to a silicon nitride layer (SiN). In the wafer cleaning apparatus according to some example embodiments, etch efficiency of a silicon nitride layer (SiN) may be enhanced by retaining the temperature Tp of the wafer W within a previously established, or, alternatively, desired temperature range while a silicon nitride layer (SiN) is selectively wet-etched.

The optical intensity detector 130 may be disposed inside the housing 100. However, the present disclosure is not limited thereto.

The optical intensity detector 130 may detect the laser L reflecting from a lower surface of the wafer W and sense on/off of the laser module 110. The controller 120 may control the laser module 110 by using on/off information of the laser module 110 detected by the optical intensity detector 130.

The temperature sensor 140 may be disposed inside the housing 100. However, the present disclosure is not limited thereto.

The temperature sensor 140 may sense the temperature of the wafer W. The controller 120 may control the laser module 110 by using the temperature information of the wafer W sensed by the temperature sensor 140.

Hereinbelow, a wafer cleaning apparatus according to some other example embodiments will be described with reference to FIG. 5. The difference from the wafer cleaning apparatus illustrated in FIG. 1 will be highlighted.

Figure 5:
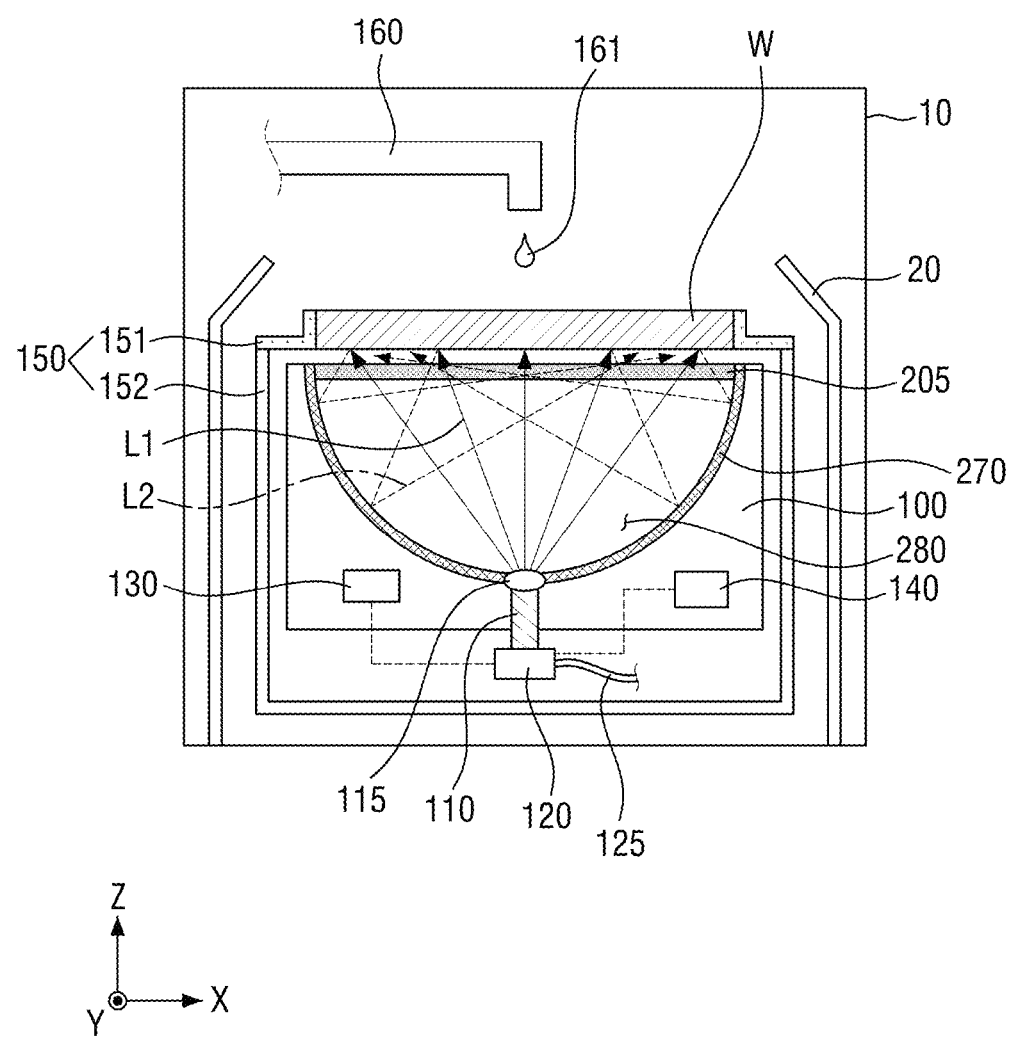
FIG. 5 is a view provided to explain a wafer cleaning apparatus according to some other example embodiments.

FIG. 5 is a view provided to explain a wafer cleaning apparatus according to some other example embodiments.

Referring to FIG. 5, the wafer cleaning apparatus according to some other example embodiments may include a reflecting plate 270 and a hollow region 280.

The hollow region 280 may be disposed between the transparent window 205 and the laser module 110 within the housing 100. The hollow region 280 may be empty space on an inner portion of the housing 100. The hollow region 280 may be defined by the transparent window 205, the reflecting plate 270 and/or a portion of the aspherical lens 115. The hollow region 280 may be a region where the first laser L1 irradiated from the laser module 110 goes toward a lower surface of the wafer W.

An upper surface of the hollow region 280 may be covered by the transparent window 205. Accordingly, the hollow region 280 may be completely isolated from an external portion by the housing 100 and the transparent window 205. The above may be performed for blocking pollution due to the liquid chemicals 161 of the laser module 110 and the hollow region 280 and fume which is generated by the liquid chemicals 161.

The hollow region 280 may be vacuum in an inner portion. As a result, the first laser L1 may go through easily. However, the present disclosure is not limited thereto. An inner portion of the hollow region 280 may be filled with gas medium, for example, which is not an obstacle for the first laser L1 to go through.

The hollow region 280 may be a hemispheric shape. The hollow region 280 may be formed in a hemispheric shape because it should reflect the laser, which reflects with a lower surface of the wafer W, with the reflecting plate 270 again. However, the present disclosure is not limited thereto, for example, the hollow region 280 may be a polygonal shape which reflects the laser as above. Accordingly, the first laser L1 may sequentially reflect with the wafer W and the reflecting plate 270, and again, reach to a lower surface of the wafer W efficiently.

The reflecting plate 270 may be disposed along a lower surface of the hollow region 280. The first laser L1 irradiated from the laser module 110 may sequentially reflect with a lower surface of the wafer W and the reflecting plate 270 and may generate second laser L2. The second laser L2 reflecting with the reflecting plate 270 may be provided to a lower surface of the wafer W again.

The laser generated as the first laser L1 reflects with a lower surface of the wafer W may cause generation of damage in a device when reaching to another portion within the chamber 10. Accordingly, the reflecting plate 270 may play a role of blocking the reflecting laser so as not to be in contact with another portion of the chamber 10. Simultaneously, the second laser L2 generated as the reflecting laser reflects again may reach to a lower surface of the wafer W and enhance efficiency of wafer W heating.

Hereinbelow, a wafer cleaning apparatus according to some other example embodiments will be described with reference to FIG. 6. The difference from the wafer cleaning apparatuses illustrated in FIGS. 1 and 5 will be highlighted.

Figure 6:
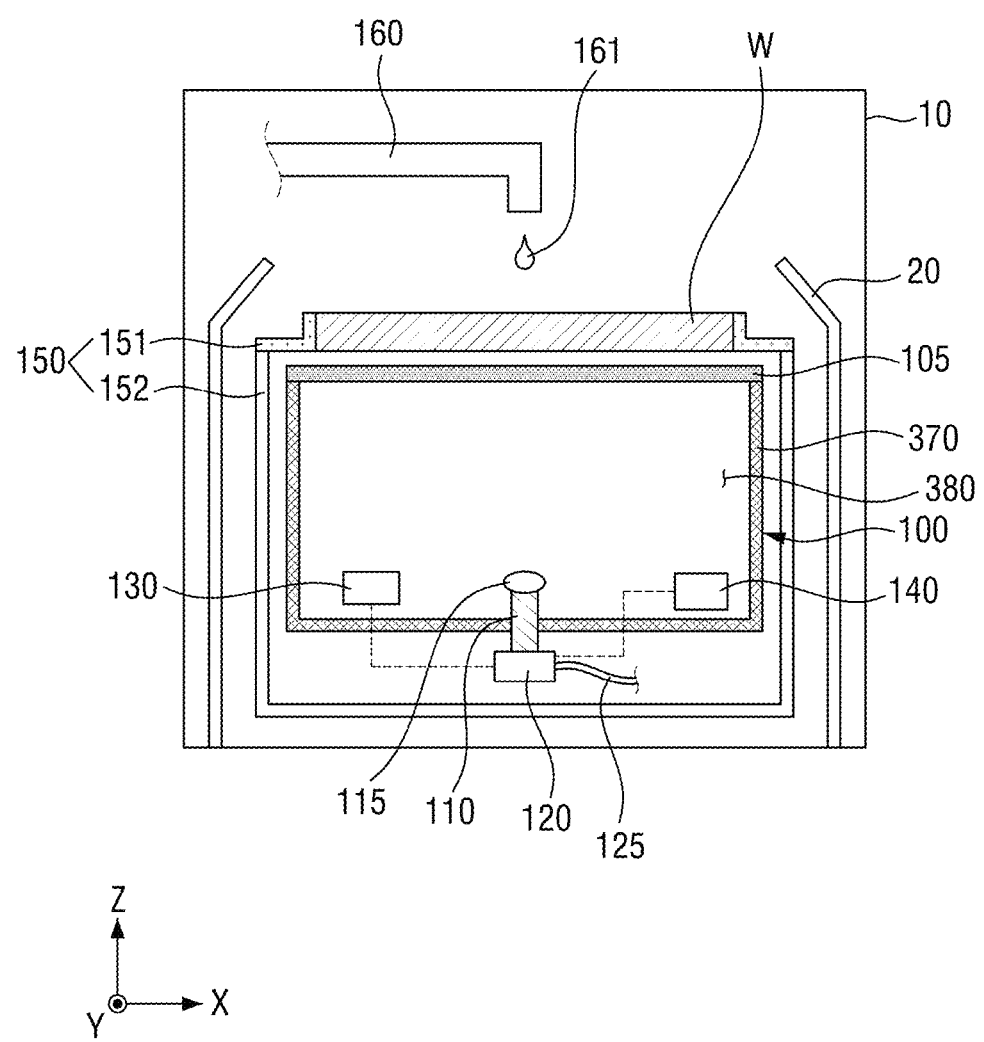
FIG. 6 is a view provided to explain a wafer cleaning apparatus according to some other example embodiments.

FIG. 6 is a view provided to explain a wafer cleaning apparatus according to some other example embodiments.

Referring to FIG. 6, in the wafer cleaning apparatus according to some other example embodiments, a reflecting plate 370 may be disposed along a sidewall and a bottom surface of a housing 100. A hollow region 380 may be disposed between a transparent window 105 and the reflecting plate 370 within the housing 100.

Hereinbelow, a wafer cleaning apparatus according to some other example embodiments will be described with reference to FIGS. 7 and 8. The difference from the wafer cleaning apparatus illustrated in FIGS. 1 and 2 will be highlighted.

Figure 7:
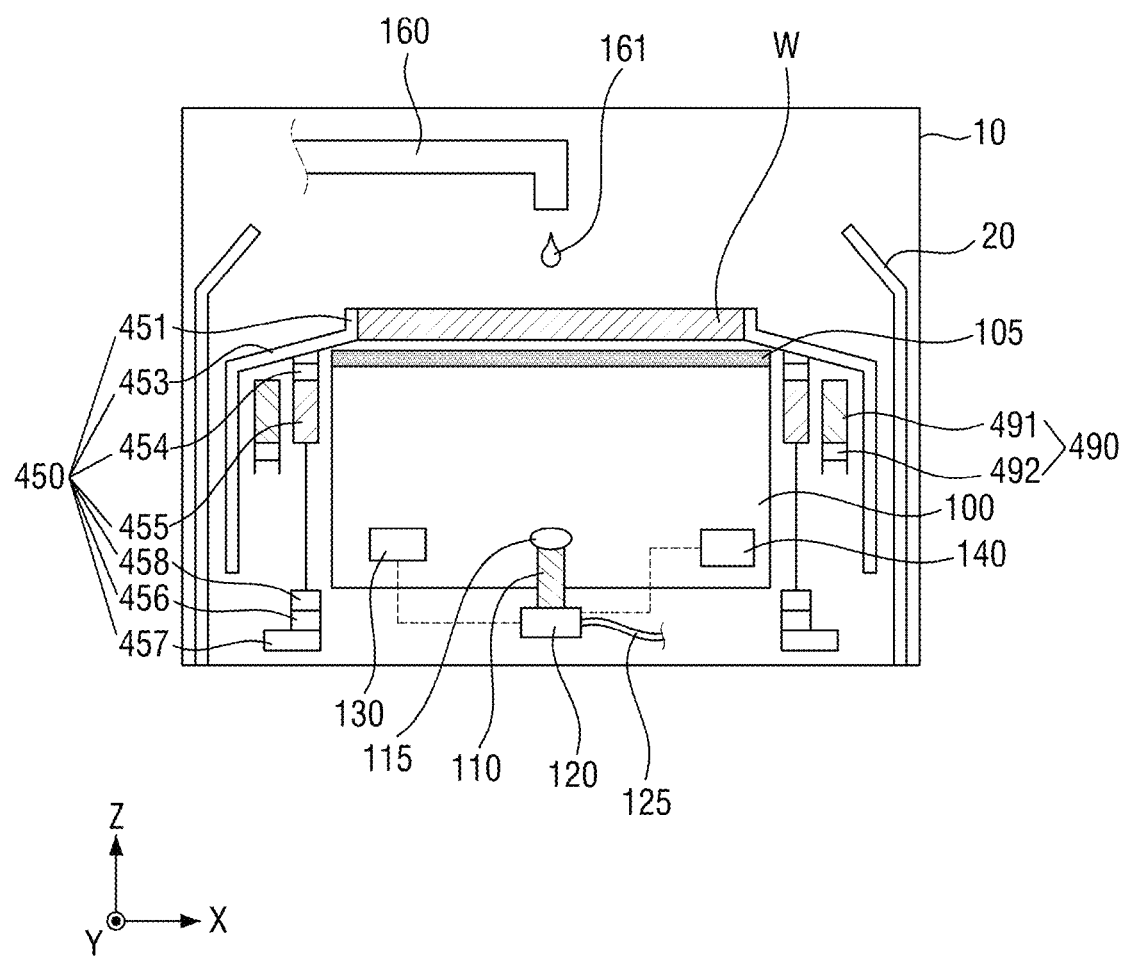
FIG. 7 is a view provided to explain a wafer cleaning apparatus according to some other example embodiments.

FIG. 7 is a view provided to explain a wafer cleaning apparatus according to some other example embodiments. FIG. 8 is a top view provided to explain a wafer cleaning apparatus according to some other example embodiments.

Figure 8:
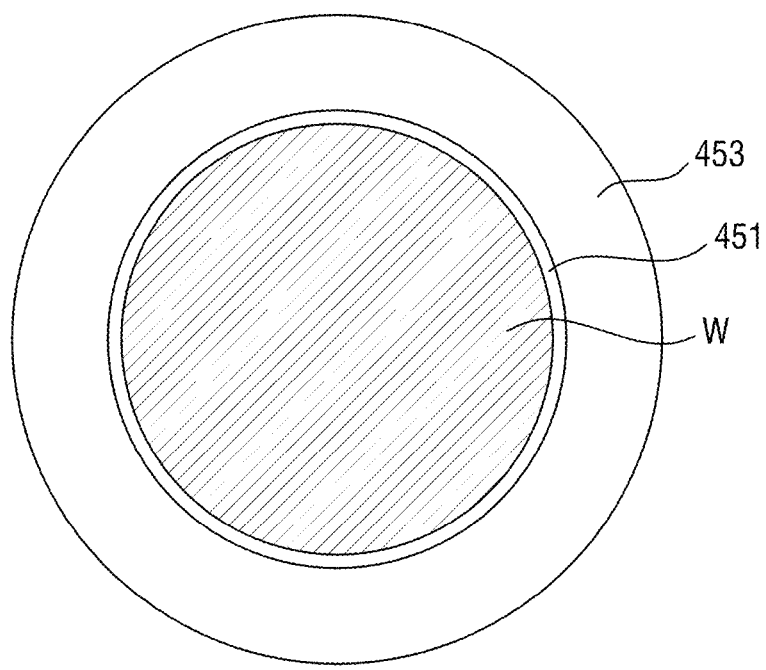
FIG. 8 is a top view provided to explain a wafer cleaning apparatus according to some other example embodiments.

Referring to FIGS. 7 and 8, the wafer cleaning apparatus according to some other example embodiments may include a spinner 450 and a fixation rotor module 490.

The spinner 450 may include a grip portion 451, a chemical drain guide 453, an insulation block 454, a first rotor 455, a sidewall 458, a bearing 456, and a fixation portion 457.

The spinner 450 may rotate the wafer W on a horizontal surface in parallel with an upper surface of the housing 100.

The grip portion 451 may be a part which is in contact with a side surface of the wafer W. The grip portion 451 may be fixed to the wafer W as being in direct contact with a side surface of the wafer W. Accordingly, the grip portion 451 may rotate on a horizontal surface in parallel with an upper surface of the housing 100.

The chemical drain guide 453 may guide a drain path of the liquid chemicals 161. The chemical drain guide 453 may be connected with the grip portion 451. The liquid chemicals 161 may be used in an etching process on an upper surface of the wafer W, and then, may be pushed away in a side surface of the wafer W with the flow.

Subsequently, the liquid chemicals 161 may reach to the chemical drain guide 453 after passing through the grip portion 451 of a side surface of the wafer W, and may be discharged. The liquid chemicals 161 may be discharged externally along the chemical drain guide 453.

Because the chemical drain guide 453 is present on a lower position compared to the bowl 20, it may prevent the liquid chemicals 161 from being discharged externally from the bowl 20. Further, the chemical drain guide 453 may be disposed farther from the other constituent elements of the spinner 450, e.g., the insulation block 454, the first rotor 455, the sidewall 458, the bearing 456, and the fixation portion 457 based on the wafer W. Accordingly, it may prevent the liquid chemicals 161 from damaging the insulation block 454, the first rotor 455, the sidewall 458, the bearing 456, and the fixation portion 457.

The insulation block 454 may be disposed to constitute a sidewall of the spinner 450 between the grip portion 451 and the chemical drain guide 453. The insulation block 454 may include an insulation material. The insulation block 454 may play a role of blocking without delivering the heat received by the grip portion 451 and the chemical drain guide 453 to the other constituent elements of the spinner 450.

Although it is illustrated in FIG. 1 that the insulation block 454 is in contact with the grip portion 451 and the chemical drain guide 453, the present disclosure is not limited thereto. That is, according to some other example embodiments, position of the insulation block 454 may be modified.

Although it is illustrated in FIG. 1 that the insulation block 454 is a single constituent element, the present disclosure is not limited thereto. That is, in some other example embodiments, the insulation block 454 may include a plurality of constituent elements.

The first rotor 455 may rotate the spinner 450 with a magnetic levitation method. The first rotor 455 may include a magnetic body.

Because the first rotor 455 may be fixed to the insulation block 454, the sidewall 458 and the grip portion 451 of the spinner 450, the spinner 450 may entirely rotate with rotation of the first rotor 455. As a result, the wafer W may rotate together with the spinner 450.

The sidewall 458 may be in contact with the first rotor 455 and may constitute a sidewall of the spinner 450. Although it is illustrated in FIG. 1 that the sidewall 458 is disposed between the first rotor 455 and the bearing 456, the present disclosure is not limited thereto. The sidewall 458 may include every portion constituting a sidewall of the spinner 450. Accordingly, the sidewall 458 may include a single constituent element as illustrated in FIG. 1, but may also include a plurality of constituent elements.

The bearing 456 may be disposed between the sidewall 458 and the fixation portion 457. However, position of the bearing 456 may not be limited thereto. The bearing 456 may be disposed anywhere when being positioned between the fixed fixation portion 457 and the rotating first rotor 455.

The bearing 456 may allow rotation of the spinner 450. That is, the bearing 456 may be minimum constituent element for feasible rotation when the spinner 450 includes the fixed fixation portion 457.

The bearing 456 may rotate together as the first rotor 455 rotates. The bearing 456 may simultaneously connect the fixation portion 457 with the sidewall 458, the first rotor 455, the insulation block 454, the grip portion 451, and the chemical drain guide 453. Accordingly, the spinner 450 may rotate simultaneously while being fixed.

The fixation portion 457 may fix the spinner 450 under of the spinner 450, and support. The fixation portion 457 may not rotate. Instead, the fixation portion 457 may be connected with the bearing 456, so that a portion of the spinner 450 rotates. As a result, the spinner 450 may rotate the wafer W as several constituent elements, except for the fixation portion 457, rotate.

The fixation rotor module 490 may be spaced apart from the spinner 450. The fixation rotor module 490 may surround the spinner 450. Specifically, the fixation rotor module 490 may be disposed between the chemical drain guide 453 and the first rotor 455. However, the present disclosure is not limited thereto.

The fixation rotor module 490 may include a second rotor 491 and a rotor supporter 492. The second rotor 491 may rotate the spinner 450 with a magnetic levitation method likewise in the first rotor 455 described above. The second rotor 491 may be spaced apart from the insulation block 454, the sidewall 458 and the grip portion 451 of the spinner 450. Further, the second rotor 491 may be connected with the rotor supporter 492.

The second rotor 491 may include a magnetic body. The second rotor 491 may generate the rotation force through the magnetic force with the first rotor 455.

Hereinbelow, a wafer cleaning apparatus according to some other example embodiments will be described with reference to FIG. 9. The difference from the wafer cleaning apparatus illustrated in FIG. 7 will be highlighted.

Figure 9:
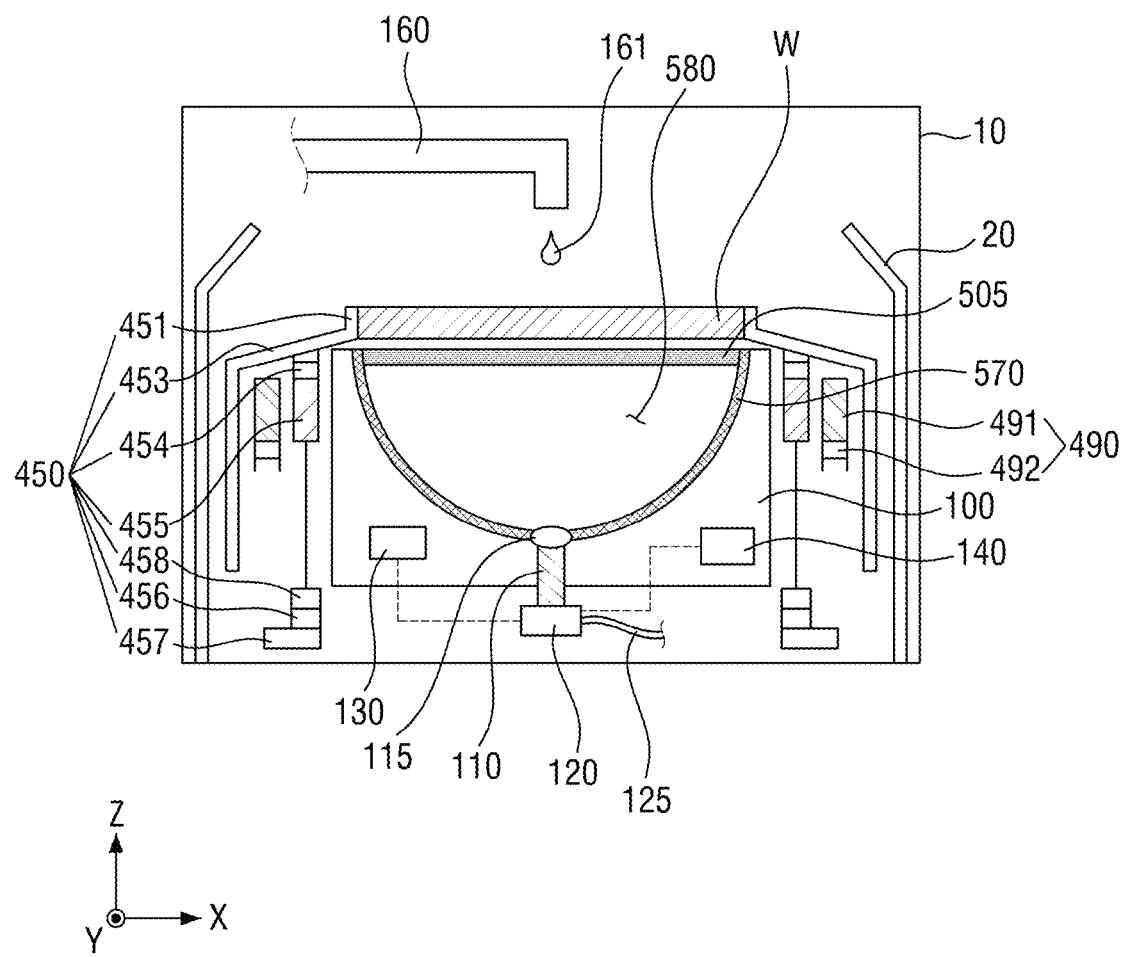
FIG. 9 is a view provided to explain a wafer cleaning apparatus according to some other example embodiments.

FIG. 9 is a view provided to explain a wafer cleaning apparatus according to some other example embodiments.

Referring to FIG. 9, the wafer cleaning apparatus according to some other example embodiments may include a reflecting plate 570 and a hollow region 580.

The hollow region 580 may be disposed between a transparent window 505 and a laser module 110 within a housing 100. An upper surface of the hollow region 580 may be covered by the transparent window 505. As a result, the hollow region 580 may be completely isolated from an external portion with the housing 100 and the transparent window 505. The hollow region 580 may be a hemispheric shape.

The reflecting plate 570 may be disposed along a lower surface of the hollow region 580. The first laser L1 of FIG. 5 irradiated from the laser module 110 may generate the second laser L2 of FIG. 5 as sequentially reflecting with a lower surface of the wafer W and the reflecting plate 570. The second laser L2 of FIG. 5 reflecting with the reflecting plate 570 may be provided to a lower surface of the wafer W again.

Hereinbelow, a wafer cleaning apparatus according to some other example embodiments will be described with reference to FIG. 10. The difference from the wafer cleaning apparatuses illustrated in FIGS. 7 and 9 will be highlighted.

Figure 10:
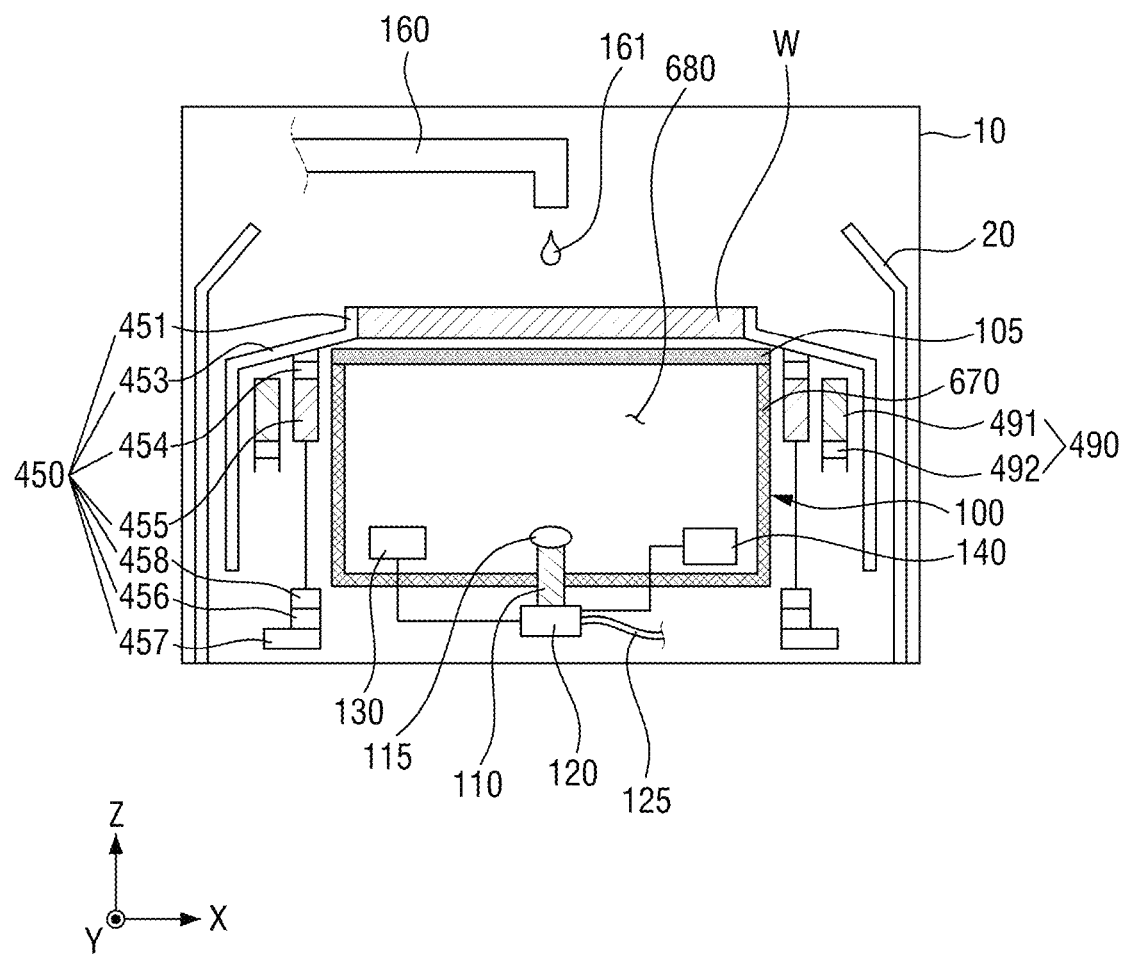
FIG. 10 is a view provided to explain a wafer cleaning apparatus according to some other example embodiments.

FIG. 10 is a view provided to explain a wafer cleaning apparatus according to some other example embodiments.

Referring to FIG. 10, in the wafer cleaning apparatus according to some other example embodiments, the reflecting plate 670 may be disposed along a sidewall and a bottom surface of the housing 100. The hollow region 680 may be disposed between the transparent window 105 and the reflecting plate 670 within the housing 100.

Hereinbelow, a method for cleaning a wafer according to some example embodiments will be described with reference to FIGS. 1 to 4 and FIGS. 11 to 15.

Figure 11:
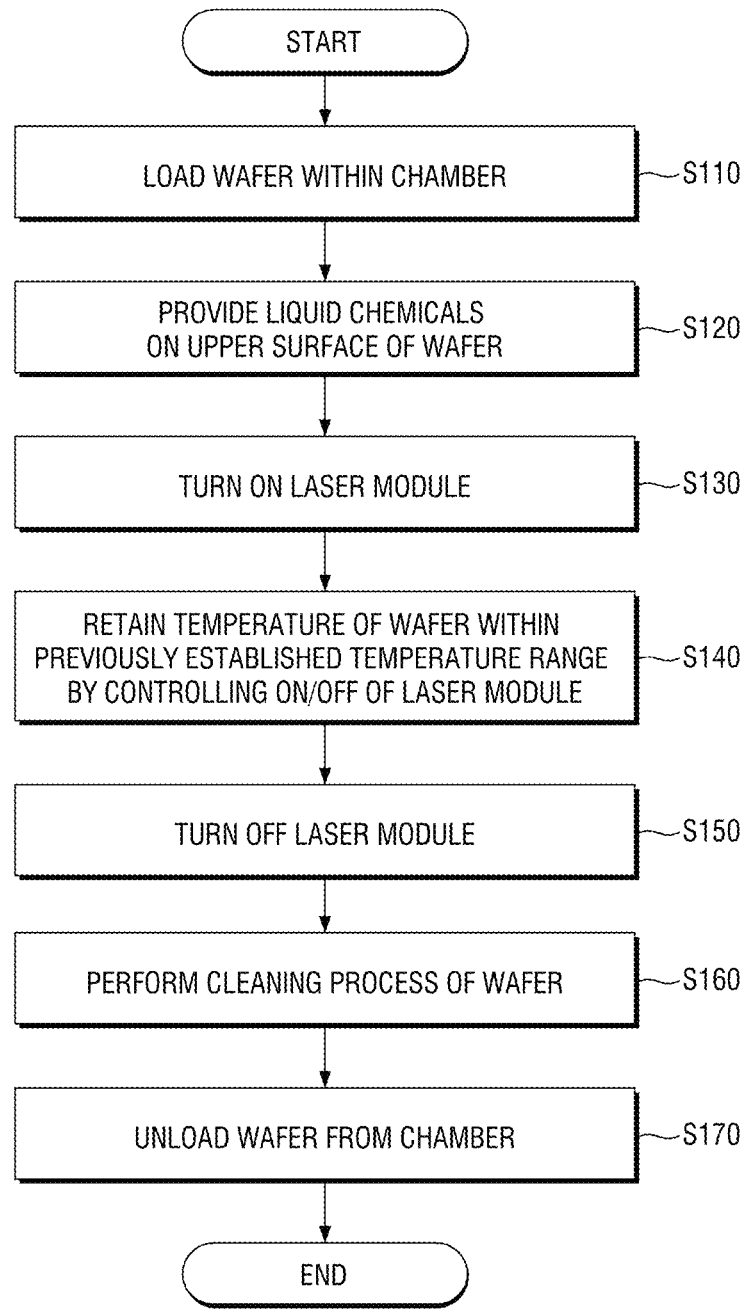
FIGS. 11 and 12 are flowcharts provided to explain a method for cleaning a wafer according to some example embodiments.
Figure 12:
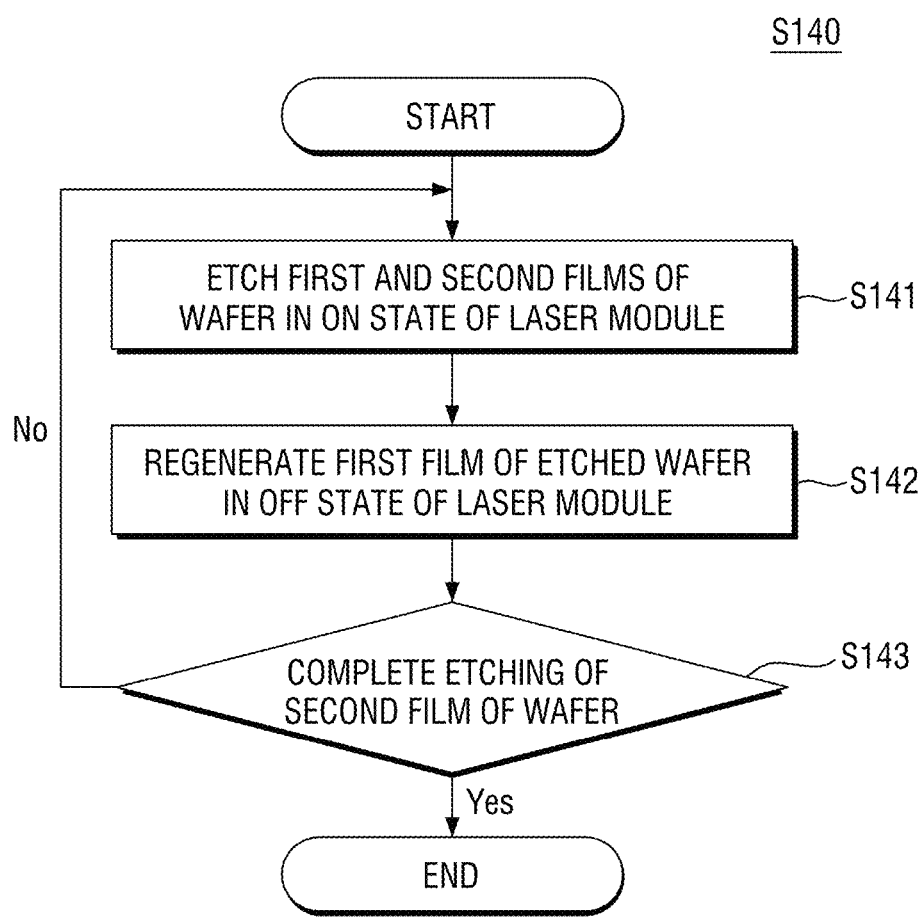
Figure 13:
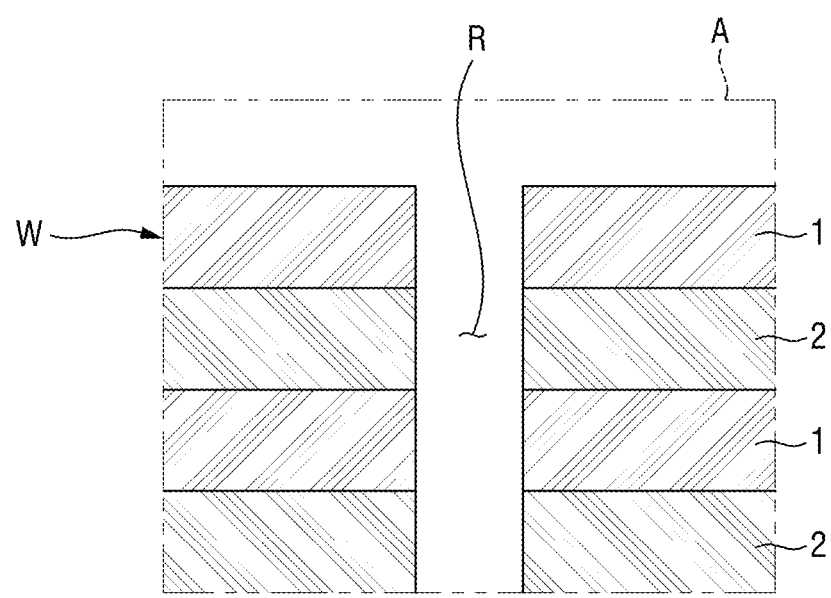
FIGS. 13 to 15 are views provided to explain a method for etching a wafer in a wafer cleaning method according to some example embodiments.
Figure 14:
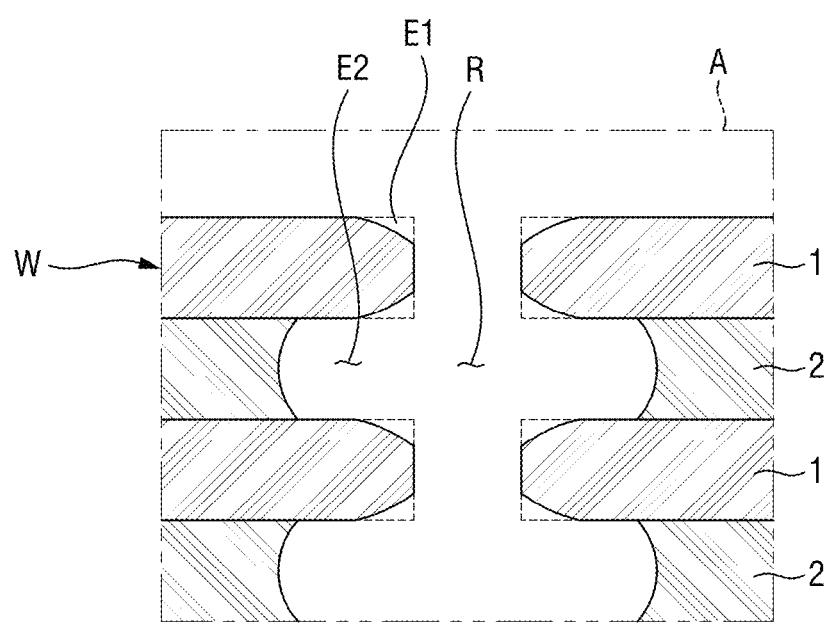
Figure 15:
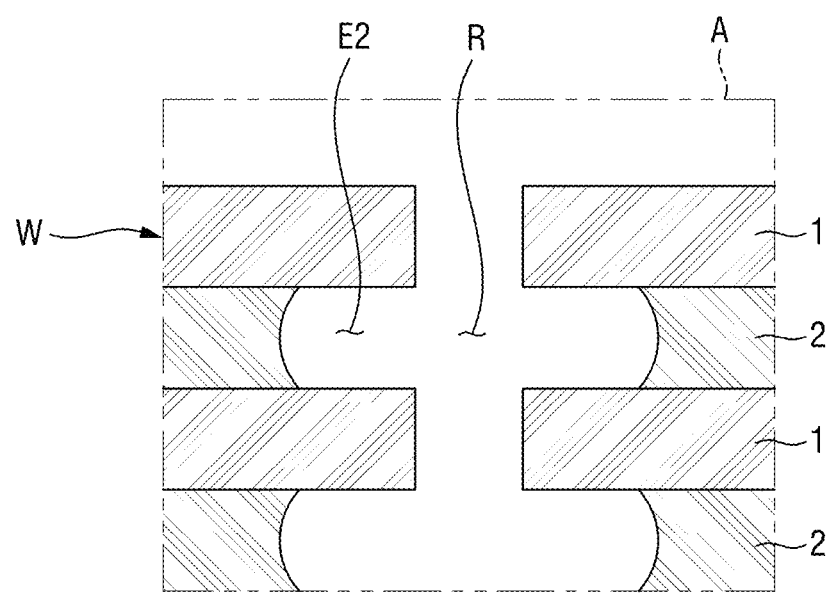

FIGS. 11 and 12 are flowcharts provided to explain a method for cleaning a wafer according to some example embodiments. FIGS. 13 to 15 are views provided to explain a method for etching a wafer in a wafer cleaning method according to some example embodiments.

Referring to FIGS. 1 to 4 and 11, the wafer W may be loaded within the chamber 10 at S110. The wafer W may be loaded on the transparent window 105. The wafer W may be held by the grip portion 151 of the spinner 150.

Subsequently, the liquid chemicals 161 may be provided on an upper surface of the wafer W at S120. The liquid chemicals 161 may be provided on an upper surface of the wafer W through the nozzle 160.

Subsequently, the controller 120 may irradiate the laser L to a lower surface of the wafer W by turning on the laser module 110 at S130.

For example, for example, as illustrated in FIG. 3, the laser L may be irradiated at second power P2. While the laser L is irradiated at the second power P2, temperature Tp of the wafer W may be elevated at more than the second temperature Tp2.

The laser L irradiated from the laser module 110 may be irradiated entirely to a lower surface of the wafer W as penetrating through the transparent window 105.

Subsequently, the controller 120 may control on/off of the laser module 110, and retain the temperature Tp of the wafer W within a previously established, or, alternatively, desired temperature range at S140. That is, the controller 120 may control on/off of the laser module 110, and retain the temperature Tp of the wafer W between the first temperature Tp1 to the second temperature Tp2.

Each of the first temperature Tp1 and the second temperature Tp2 may be 170° C. to 250° C. For example, the first temperature Tp1 may be 170° C., and the second temperature Tp2 may be 250° C.

Respective one on and one off of the laser module 110 may be defined as one cycle. For example, within one cycle of the laser module 110, a ratio of time when the laser module 110 is on may be 30% to 50%. Time t1 when the laser module 110 is on may be, for example, 0.5 to 3 seconds.

While the temperature Tp of the wafer W is retained between the first temperature Tp1 to the second temperature Tp2, an etch process (e.g., wet etching) of the wafer W may be performed.

Specifically, referring to FIG. 13, the wafer W may include a first layer 1 and a second layer 2. For example, the wafer W may include a first layer 1 and a second layer 2 which are alternately stacked from each other. The first layer 1 may be, for example, a silicon oxide layer (SiO2), and the second layer 2 may be, for example, a silicon nitride layer (SiN). The wafer W may include a trench R which penetrates through the first layer 1 and the second layer 2 in the third direction Z, for example.

The controller 120 may turn off the laser module 110 after the temperature Tp of the wafer W is elevated at more than the second temperature Tp2.

Referring to FIGS. 12 and 14, when the temperature Tp of the wafer W is declined to be close to the first temperature Tp1, the controller 120 may turn on the laser module 110.

While the laser module 110 is on, the first layer 1 and the second layer 2 of the wafer W may be etched as an etchant is injected through a trench R formed on the wafer W at S141. For example, the second layer 2 may be further etched compared to the first layer 1. That is, with respect to the first layer 1, a portion corresponding to a first etch region E1 exposed to the trench R may be etched, and with respect to the second layer 2, a portion corresponding to a second etch region E2 exposed to the trench R may be etched. The second etch region E2 may be formed to be indented between the first layer 1.

A formula, in which the first layer 1 (e.g., silicon oxide layer (SiO2)) is etched, is as follows (1).

$$SiO_2 + 2H_2O \rightarrow Si(OH)_4 \qquad (1)$$

A formula, in which the second layer 2 (e.g., silicon nitride layer (SiN)) is etched, is as follows (2).

$$3Si_3N_4 + 27H_2O + 4H_3PO_4 \rightarrow 4(NH_4)_3PO_4 + 9H_2SiO_3 \qquad (2)$$

A difference in etching amount between the first layer 1 and the second layer 2 may be caused from etch selectivity of the first layer 1 and the second layer 2 with respect to an etchant.

Referring to FIGS. 12 and 15, when the temperature Tp of the wafer W is elevated at the second temperature Tp2, the controller 120 may turn off the laser module 110.

While the laser module 110 is off, the first layer 1 of the etched wafer W may be regenerated at S142. The first layer 1 may be regenerated on a portion corresponding to the first etch region E1 of FIG. 14. For example, the first layer 1 may be regenerated until the temperature Tp of the wafer W falls down to the first temperature Tp1.

A formula, in which the first layer 1 (e.g., silicon oxide layer (SiO2)) is regenerated, is as follows (3).

$$Si(OH)4 \rightarrow SiO2 + 2H2O \qquad (3)$$

Until etching of the second layer 2 completes, the etching of the first layer 1 and the second layer 2 and regenerating of the first layer 1 may repeat.

When etching of the second layer 2 is etched as many as a previously established, or, alternatively, desired etching amount, an etching process with respect to the wafer W may complete at S143.

Referring to FIGS. 1 to 4 and 11 again, after an etching process with respect to the wafer W completes, the controller 120 may turn off the laser module 110 at S150. After the laser module 110 is off, the temperature Tp of the wafer W may fall down under the first temperature Tp1.

Subsequently, a cleaning process with respect to the wafer W may be performed at S160. After a cleaning process with respect to the wafer W completes, the wafer W may be unloaded from the chamber 10 at S170.

Example embodiments according to the present disclosure were explained hereinabove with reference to the drawings attached, but it should be understood that the present disclosure is not limited to the aforementioned example embodiments, but may be fabricated in various different forms, and may be implemented by a person skilled in the art in other specific forms without altering the technical concept or essential characteristics of the present disclosure. Accordingly, it will be understood that the example embodiments described above are only illustrative, and should not be construed as limiting.

What is claimed is:

1. A wafer cleaning apparatus, comprising:
a chamber configured to be loaded with a wafer;
a nozzle above the wafer and configured to provide liquid chemicals on an upper surface of the wafer;
a housing spaced apart from and under the wafer;
a laser module configured to irradiate a laser on the wafer, the laser module being within the housing, the laser supplied external to the housing;
a transparent window between the wafer and the laser module; and
a controller configured to
control an on/off state of the laser module,
turn the laser module on and off, and
retain a temperature of the wafer within a temperature range, and
a ratio of time the laser module is on in one cycle of the on/off state of the laser module is 30% to 50%.

2. The wafer cleaning apparatus of claim 1, wherein the temperature range of the wafer is 170° C. to 250° C.

3. The wafer cleaning apparatus of claim 1, wherein time when the laser module is on is 0.5 to 3 seconds in one cycle of the on/off state of the laser module.

4. The wafer cleaning apparatus of claim 1, wherein the laser module irradiates the laser entirely to a lower surface of the wafer.

5. The wafer cleaning apparatus of claim 1, further comprising:
a laser supply unit configured to supply the laser to the laser module, and
an aspherical lens configured to process a profile of the laser.

6. The wafer cleaning apparatus of claim 1, further comprising:
an optical intensity detector configured to detect the laser reflecting from the wafer and sense the on/off state of the laser module.

7. The wafer cleaning apparatus of claim 1, wherein a wavelength of the laser is 300 nm to 1,100 nm.

8. The wafer cleaning apparatus of claim 1, further comprising:
a hollow region between the transparent window and the laser module within the housing, and
a reflecting plate along a lower surface of the hollow region.

* * * * *